(12) United States Patent
Fournel et al.

(10) Patent No.: US 12,721,248 B2
(45) Date of Patent: Aug. 25, 2026

(54) METHOD OF ASSEMBLY BY DIRECT BONDING OF ELECTRONIC COMPONENTS

(71) Applicant: Commissariat à l'Énergie Atomique et aux Énergies Alternatives, Paris (FR)

(72) Inventors: Frank Fournel, Grenoble (FR); Christophe Morales, Grenoble (FR); Loïc Sanchez, Grenoble (FR); Brigitte Montmayeul, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 853 days.

(21) Appl. No.: 18/087,538

(22) Filed: Dec. 22, 2022

(65) Prior Publication Data

US 2023/0207515 A1 Jun. 29, 2023

(30) Foreign Application Priority Data

Dec. 23, 2021 (FR) ...................................... 2114441

(51) Int. Cl.

| | |
|---|---|
| ***H10W 99/00*** | (2026.01) |
| ***H10W 72/00*** | (2026.01) |
| ***H10W 72/90*** | (2026.01) |
| *H10W 80/00* | (2026.01) |
| *H10W 90/00* | (2026.01) |

(52) U.S. Cl.

CPC .......... *H10W 99/00* (2026.01); *H10W 72/019* (2026.01); *H10W 72/07338* (2026.01); *H10W 72/90* (2026.01); *H10W 80/102* (2026.01); *H10W 80/211* (2026.01); *H10W 80/312* (2026.01); *H10W 90/796* (2026.01)

(58) Field of Classification Search

None

See application file for complete search history.

(56) References Cited

U.S. PATENT DOCUMENTS

| | | | | |
|---|---|---|---|---|
| 10,790,260 | B2 * | 9/2020 | Liu | H01L 25/0657 |
| 11,094,683 | B2 * | 8/2021 | Wunsch | B01L 3/502707 |
| 2007/0218588 | A1 * | 9/2007 | Takiar | H01L 25/0657 438/109 |
| 2018/0130691 | A1 * | 5/2018 | Uzoh | H01L 24/75 |

(Continued)

FOREIGN PATENT DOCUMENTS

| | | |
|---|---|---|
| FR | 3 105 569 A1 | 6/2021 |

OTHER PUBLICATIONS

Preliminary Search Report for French Application No. 2114441, dated Jul. 25, 2022.

*Primary Examiner* — Michelle Mandala

(74) *Attorney, Agent, or Firm* — Wolf, Greenfield & Sacks, P.C.

(57) ABSTRACT

A method of preparation of a first surface of an electronic component, the first surface being intended to be bonded to another electronic component by a direct bonding and the first surface having previously been submitted to a surface treatment in an atmosphere including nitrogen, for example, a treatment in a nitrogen plasma or an ozone UV treatment, the preparation method including: placing into contact the first surface with an aqueous solution including at least 90% water, for a contacting duration longer than or equal to 30 minutes; and then drying the first surface.

16 Claims, 7 Drawing Sheets

(56) References Cited

U.S. PATENT DOCUMENTS

2019/0252221 A1* 8/2019 Chen .................. H01L 21/6835
2020/0075444 A1 3/2020 Luo et al.
2020/0312834 A1 10/2020 Wunsch et al.
2021/0375850 A1 12/2021 Uzoh et al.

* cited by examiner 220
210
222

METHOD OF ASSEMBLY BY DIRECT BONDING OF ELECTRONIC COMPONENTS

CROSS-REFERENCE TO RELATED APPLICATION

This application claims priority to French application number 2114441, filed Dec. 23, 2021, the contents of which is incorporated herein by reference in its entirety.

TECHNICAL BACKGROUND

The present disclosure generally concerns the bonding together of electronic components, more particularly of microelectronic components. The present disclosure particularly concerns the direct bonding of microelectronic components.

PRIOR ART

Direct bonding, also called "molecular bonding", is a technique of assembly of microelectronic components enabling to rigidly assemble two surfaces, one for each microelectronic component, by molecular adhesion via a placing into direct contact of these two surfaces, without using a bonding material.

It is possible to assemble by direct bonding two wafers together, according to a technique called "wafer-to-wafer", for example, two wafers of different materials and/or of different dimensions.

It is also possible to assemble by direct bonding a die on a substrate (for example a wafer), according to a technique called "die-to-wafer". This technique aims at transferring a die onto a substrate, each being potentially previously functionalized, that is, provided with electronic components. An extension of this technique is the direct bonding of a plurality of dies on a substrate, simultaneously or not.

In the context of the direct bonding of a die on a substrate, the die to be bonded may be positioned in an adapted fashion against the substrate by using a capillarity-assisted direct bonding technique, by using a fluid, generally water. The fluid may be deposited on the die or on the substrate. This bonding technique is used in the bonding technique called "self-aligned" where it is further desired to guarantee an accurate alignment of the die with respect to the substrate.

This technique of direct bonding by capillarity may in particular be applied for a direct bonding of a plurality of dies on a substrate, in particular to simultaneously bond a plurality of dies on a substrate, but this technique is then made more complex, and a defective bonding of certain dies on the substrate can be observed.

SUMMARY OF THE INVENTION

There is a need to improve the technique of direct bonding of dies on a substrate, particularly the capillarity-assisted direct bonding technique, and more generally the technique of direct bonding of electronic components to one another.

An embodiment overcomes all or part of the disadvantages of known direct bonding techniques.

An embodiment provides a method of preparation of a first surface of an electronic component, said first surface being intended to be bonded to another electronic component by a direct bonding and said first surface having previously been submitted to a surface treatment in an atmosphere comprising nitrogen, for example, a treatment in a nitrogen plasma or a UV ozone treatment, the preparation method comprising:

- the placing into contact of said first surface with an aqueous solution comprising at least 90% of water, for a contacting duration longer than or equal to 30 minutes; and then
- the drying of said first surface.

According to an advantageous embodiment, the contacting duration is longer than 30 minutes, for example longer than or equal to 40 minutes, or even longer than or equal to 50 minutes. For example, the contacting duration is equal to approximately 50 minutes.

According to an embodiment, the contacting duration is longer than 30 minutes and shorter than or equal to 120 minutes, for example advantageously longer than or equal to 40 minutes and shorter than or equal to 120 minutes, or even longer than or equal to 40 minutes and shorter than or equal to 60 minutes.

According to an embodiment, the aqueous solution is deionized water, or a solution of deionized water to which a base or an acid has been added with a concentration lower than 10%, preferably lower than 1%, or a solution of deionized water to which an amphoteric compound has been added, for example, oxygenated water.

According to an embodiment, the placing into contact with the aqueous solution comprises a soaking in said aqueous solution.

According to an embodiment, the contacting duration is longer than or equal to one hour.

According to an embodiment, the placing into contact with the aqueous solution is performed at a temperature greater than the room temperature and lower than 100° C., preferably lower than 80° C.

According to an embodiment, the drying is a drying by centrifugation or uses a drier.

According to an embodiment, the electronic component is an electronic die.

According to an embodiment, the electronic component is a substrate, for example, a wafer.

According to an embodiment, the preparation method comprises, prior to the step of placing into contact with the aqueous solution, a step of a treatment of the first surface in an atmosphere comprising nitrogen, for example, with a nitrogen plasma or a UV ozone treatment.

An embodiment provides a method of assembly by direct bonding of a first surface of at least one first electronic component and of a first surface of a second electronic component, the assembly method comprising a step of preparation of at least one among the first surface of the at least one first electronic component and the first surface of the second electronic component according to the method of preparation of an embodiment, prior to the direct bonding.

According to an embodiment, the direct bonding is a capillarity-assisted direct bonding.

According to an embodiment, the direct bonding is obtained by evaporation of a liquid, preferably water, arranged between the first surface of the at least one first electronic component and the first surface of the second electronic component.

According to an embodiment, there is a plurality of said at least one first electronic component, said first electronic components being electronic dies, and the second component being a substrate, for example, a wafer.

According to an embodiment, the assembly method comprises:

- a step of positioning of the dies on a die support, said support being adapted to holding the dies in individualized fashion for their assembly to the substrate;
- a step of a forming of a liquid film, for example, a deionized water film, on the first surface of the substrate;
- a step of placing into contact of the dies with the liquid film, said placing into contact causing an attraction of said dies towards the substrate;
- a step of evaporation of the liquid film so as to bond the dies to the substrate by direct bonding;
- the step of preparation comprising the preparation, for example according to the method of preparation described above, of the first surfaces of the dies, and being carried out after the positioning step, and before the step of placing into contact with the liquid film.

According to an embodiment, the placing into contact of the dies with the liquid film is ensured by bringing together the substrate and the die support.

According to an embodiment, the assembly method comprises the use of at least one stop arranged between the substrate and the die support to stop the bringing together that ensures the placing into contact of the dies with the liquid film.

According to an embodiment, the die support comprises cavities, each die being positioned in a cavity, the first surface of said die protruding from said cavity, and the assembly method comprises a step of removal of the dies from the cavities, said removal step being implemented after the placing into contact of the dies with the liquid film and before the bonding of the dies to the substrate.

According to an embodiment, the die support comprises an adhesive film having the dies pasted thereto, said adhesive film having an elasticity such that it deforms during the evaporation step, and the assembly method comprises, after the bonding of the dies to the substrate, a step of removal of the adhesive film.

According to a specific embodiment, the step of removal of the adhesive film comprises a step of heating of said adhesive film or a step of exposure of said adhesive film to an ultraviolet radiation.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which.

DESCRIPTION OF THE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the steps of preparation of individual dies and/or of a substrate, and the electric contacts between electronic components, are not shown.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms “front”, “back”, “top”, “bottom”, “left”, “right”, etc., or to relative positional qualifiers, such as the terms “above”, “below”, “upper”, “lower”, etc., or to qualifiers of orientation, such as “horizontal”, “vertical”, etc., reference is made to the orientation shown in the figures.

Unless specified otherwise, the expressions “around”, “approximately”, “substantially” and “in the order of” signify within 10%, and preferably within 5%.

Figures 1, 2:
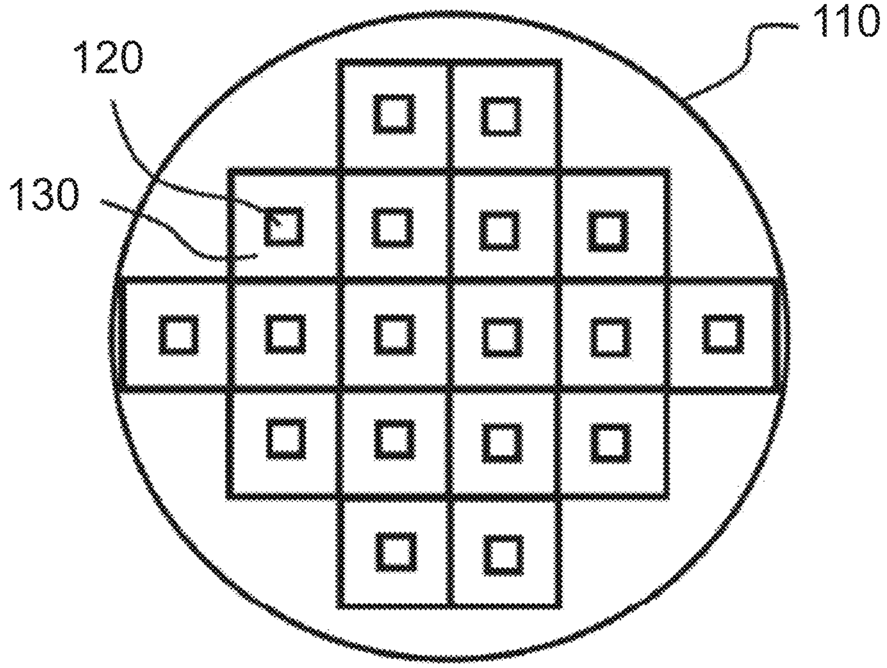
FIG. 1 schematically shows dies bonded to a substrate via a direct bonding assembly method.
FIG. 2 is an acoustic microscope view of dies on a substrate after a method of assembly by capillarity-assisted direct bonding.

A method of assembly of a plurality of dies 120 on a substrate 110 by direct bonding for example enables to obtain the structure visible in FIG. 1 where dies 120 are bonded to substrate 110.

Dies 120 may have been submitted to technological steps of microelectronics, for example: deposition of material, photolithography, and/or etching. Dies 120 may comprise or be based on silicon (Si), indium phosphide (InP), gallium arsenide (GaAs), silicon carbide (SiC), germanium (Ge), sapphire. They may exhibit at their surface layers of materials such as silica, silicon nitride, metals such as copper or titanium, and any other known layers of microelectronics, such as a layer of hafnium oxide ($HfO_2$), of organosilicon material (SiOC), of aluminum nitride (AlN), or of alumina ($Al_2O_3$). Dies 120 may be electronic dies.

Substrate 110 may comprise electronic components 130 to be coupled, for example, to be connected, preferably electrically, to dies 120 by direct bonding of these dies on substrate 110.

Substrate 110 may be a wafer, for example a silicon wafer, to which technological steps have been applied to form electronic components 130. Substrate 110 comprising electronic components 130 is also called functionalized substrate.

FIG. 1 particularly illustrates dies 120 bonded by direct bonding to substrate 110 comprising electronic components 130, a die being bonded for example to an electronic component 130.

A first technique to assemble dies on the substrate by capillarity-assisted direct bonding comprises placing a drop of water on each die and then positioning the die/drop assembly on the substrate, with the drop in contact with the substrate. After the drying of the water, each die ends up being bonded by direct bonding to the substrate.

Another technique comprises placing a water film on the substrate and positioning the dies on this water film. After drying of the water film, the dies end up being bonded by direct bonding on the substrate.

An example of a method of bonding dies to a substrate according to this other technique is for example described in publication "Collective Die Direct Bonding for Photonic on Silicon" (L. Sanchez, F. Fournel, B. Montmayeul, L. Bally, B. Szelag, and L. Adelmini, ECS Trans. 86, 223 (2018)).

According to an example, the liquid film, for example, water, is deposited on a first surface of a substrate, and the dies are installed on a die support. This support has the advantage of being capable of simultaneously presenting a plurality of dies for their assembly to the substrate. Then, the dies on their support are placed into contact with the liquid film, causing an attraction by capillarity of the dies towards the substrate. Then, the liquid film is removed by evaporation, and the dies end up being bonded to the substrate. The assembly may be submitted to a thermal treatment, or thermal anneal, to in particular reinforce the bonding energy. This anneal is advantageously carried out at low temperature, typically lower than or equal to 400° C. to avoid degrading the assembly and particularly its electric properties.

The surfaces of the substrate and/or of the dies intended to be assembled to each other may be previously prepared to remove the organic contamination on these surfaces and/or increase the hydrophily of these surfaces, for example a plasma treatment in air or nitrogen ($N_2$) or a UV-Ozone treatment in air (UV for Ultra Violet). Such a treatment may enable to increase the bonding energy obtained after the anneal step. It is specified that a UV-ozone treatment in air comprises exposing the surface to be treated to a UV radiation in the presence of air, which creates ozone.

However, a very high defectivity has been observed at the die bonding interface on the substrate after the removal of the liquid film or drop, when the surfaces of the substrate and/or of the dies intended to be assembled to each other have received such a plasma treatment in air or nitrogen, or such a previous UV-Ozone treatment in air. This is illustrated by an example in FIG. 2, illustrating dies 220 (black squares) on a substrate 210 (white disk), the white dots 222 at the level of the dies corresponding to defective bondings.

The inventors provide a method of assembly by direct bonding enabling to address the previously-described improvement needs, and to overcome all or part of the disadvantages of the previously-described assembly methods. In particular, the inventors provide a method of preparing electronic components and a method of assembly by direct bonding of said electronic components to one another, for example, of one or a plurality of dies on a substrate, enabling to improve the bonding of said electronic components to one another.

Embodiments of systems will be described hereafter. The described embodiments are non-limiting and various variants will occur to those skilled in the art based on the indications of the present disclosure.

In the following description, methods of assembly by direct bonding of a plurality of dies on a substrate are described. Other methods of assembly by direct bonding of a plurality of dies on a substrate may be envisaged. Similarly, other methods of assembly by direct bonding of a die on a substrate, or more generally of a plurality of electronic components to one another, can be envisaged by those skilled in the art.

FIGS. 3A to 3D are cross-section views showing steps of a method of assembly by capillarity-assisted direct bonding according to a first embodiment.

This method implements an assembly system 330 comprising:

- a support 331 of dies 320, said die support comprising cavities 332 formed from a first surface 331*a* of said support and each schematically shown in dotted lines, each cavity being adapted to containing a die 320 so that an upper portion of said die protrudes from said cavity;
- optionally, stops 333*a*, 333*b* (or wedges) adapted to being positioned on the first surface 331*a* of support 331; such stops aim at stopping the bringing together of dies 320 when they are positioned in cavities 332 and substrate 310, as described hereafter; and
- an assembly device comprising a lower support element 334 and an upper support element 335 displaceable with respect to lower support element 334, for example, by using guides 336*a*, 336*b*; the lower and upper support elements may also each be called "chuck"; the upper support element is preferably a suction element.

Support 331 may be a mechanical handle, for example, formed by a rigid plate. Such a mechanical handle may comprise, for example be formed of or be coated with, silicon, silicon dioxide, sapphire, germanium, silicon carbide, alumina, or silicon nitride.

The cavities 332 formed in support 331 may have different shapes and geometries, for example, when the dies have different shapes and geometries. In particular, the depth of a cavity is adapted to the die that it is to receive and particularly to its thickness, and is determined so that an upper portion of said die protrudes from said cavity.

Figure 3A:
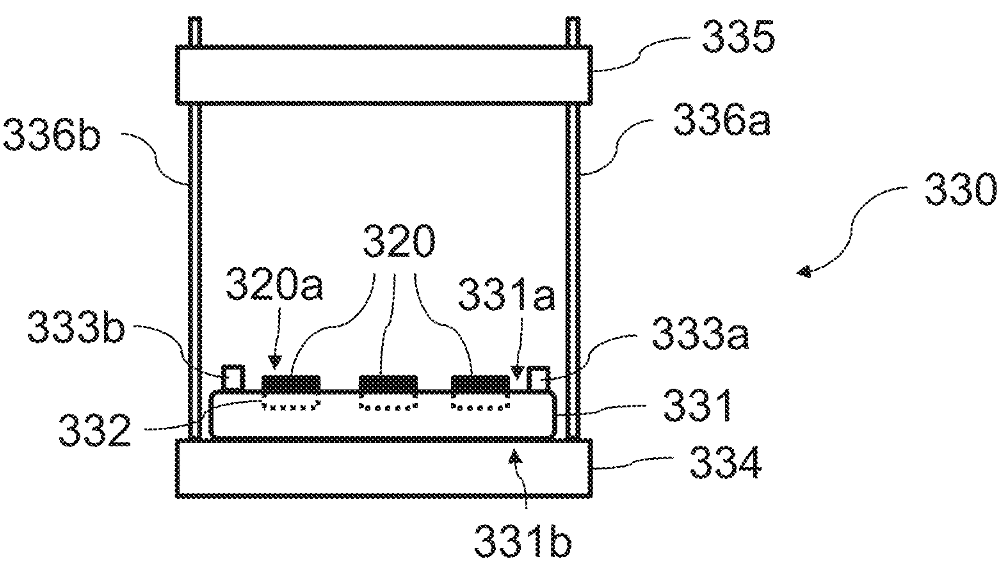
FIG. 3A, FIG. 3B, FIG. 3C, and FIG. 3D are cross-section views showing steps of a method of assembly by capillarity-assisted direct bonding according to a first embodiment.

Steps of the method are described hereafter first in relation with FIG. 3A.

Dies 320 are placed in the cavities 332 of support 331, the thickness of dies 320 being in the direction of the depth of cavities 332.

Dies 320 may be placed in cavities 332 by means of a die handling device, also called "pick and place", while avoiding touching the surfaces of the dies which are going to be bonded by direct bonding to substrate 310.

Once dies 320 are in position in cavities 332, a step of surface treatment of said dies, for example, a $N_2$ plasma treatment or an ozone treatment in air, is carried out. The surface treatment of each die 320 is performed at least on a first surface 320*a* of said die intended to be assembled to substrate 310 (said first surface being comprised within the upper portion of the die which protrudes from the cavity).

Then, an after-treatment of dies 320 comprising a step of placing into contact said dies with, for example, of soaking in, an aqueous solution comprising at least 90% of water, is carried out, for at least 30 minutes and preferably at least 1 hour, followed by a step of drying said dies, for example, by centrifugation. The placing into contact with the aqueous solution is performed at least on the first (treated) surfaces 320*a* of the dies.

The steps of surface treatment and after-treatment may be altogether called "step of preparation" or "method of preparation" (of the dies and/or of the substrate, more generally of an electronic component intended to be assembled to another electronic component). It should be noted that the after-treatment may be carried out during the surface treatment, for example after a surface treatment implementing nitrogen and before another surface treatment which does not implement nitrogen.

After the steps of surface treatment and of after-treatment of the dies, stops 333*a*, 333*b* may be arranged on sides of the first surface 331*a* of support 331, said dies 320 being between said stops.

Support 331, provided with dies 320 and with stops 333*a*, 333*b*, is positioned, on the side of its second surface 331*b*, on lower support element 334. Preferably, lower support element 334 is substantially horizontal during the positioning of support 331, and held substantially horizontal afterwards, typically at most plus or minus 1° and preferably at most plus or minus 0.1°.

Substrate 310 may be prepared according to the same preparation protocol as for dies 320, that is, a step of surface treatment and an after-treatment, at least on a first surface 310*a* of said substrate intended to be assembled with dies 320.

Figure 3B:
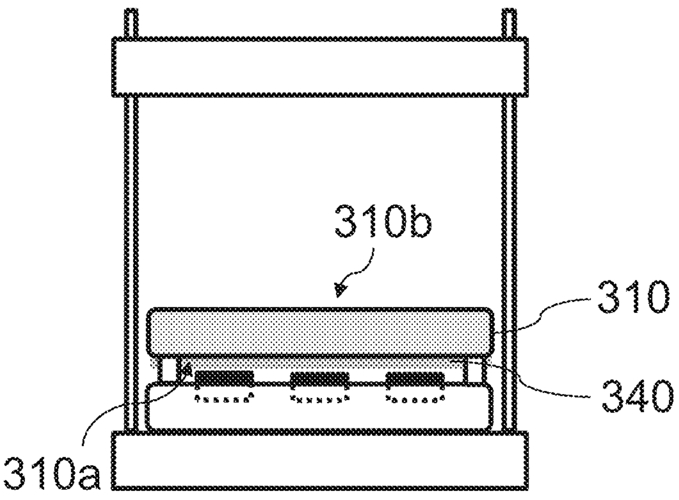

Next steps of the method are described hereafter in relation with FIG. 3B.

A liquid film 340, for example, a water film, is formed on the first surface 310*a* of substrate 310, for example, by deposition of the liquid and centrifugation. The thickness of the liquid film is for example in the range from 10 to 100 μm.

Substrate 310 is then flipped and positioned above support 331 by placing dies 320 into contact with liquid film 340. If they are present, this positioning corresponds to laying substrate 310 on the stops 333*a*, 333*b* already positioned on support 331. Preferably, during the bringing together of support 331 and of substrate 310, said support and said substrate are each held substantially horizontal, typically at most plus or minus 1° and preferably at most plus or minus 0.1°.

Figure 3C:
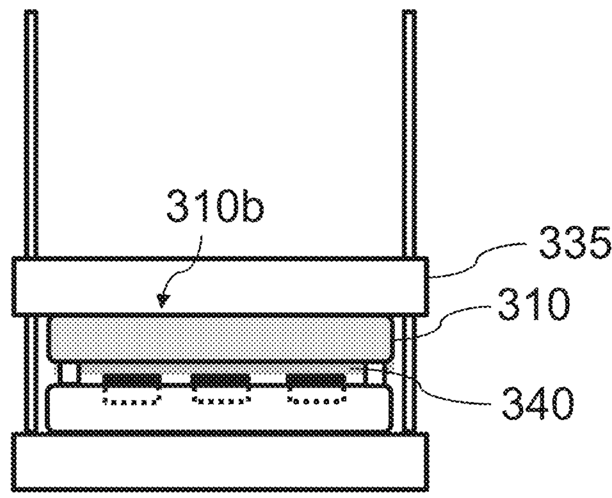

Then, as illustrated in FIG. 3C, upper suction support element 335 is taken down against the second surface 310*b* of substrate 310.

Then, once substrate 310 has been sucked by upper support element 335, said upper support element is raised to lift substrate 310, and this, preferably by keeping the horizontality of said substrate, to avoid the slipping of liquid film 340 during its evaporation, which slipping might result in misaligning the dies 320 to be bonded to substrate 310. Indeed, the lifting of the substrate enabling to remove the dies from cavities 332, said dies are then only held by the liquid film.

Figure 3D:
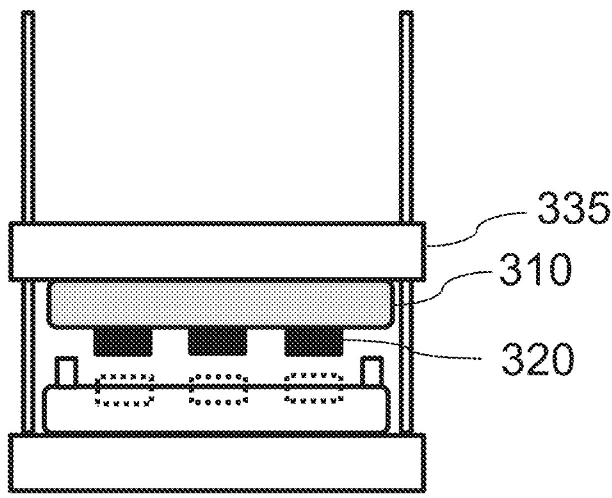

The, as illustrated in FIG. 3D, liquid film 340 is evaporated. As soon as the time necessary for the evaporation of the liquid film has elapsed, dies are assembled by direct bonding on substrate 310, and the substrate/die structure may be removed from system 330.

As known by those skilled in the art, this substrate/die structure is then annealed, for example at 200° C. or 400° C., or even more.

A specific example of the first embodiment is now disclosed.

Before being placed in the cavities, dies 320 are prepared as follows: the thickness of three indium phosphide wafers (InP) having a 50-mm diameter which will be sawn to form dies 320 is measured. The measured thicknesses of these three wafers are all in the range from 325 μm to 375 μm. Dies 320 are formed by sawing of the three InP wafers. These dies 320 each have, orthogonally to their thickness, a square profile of 10 mm by 10 mm.

The support (mechanical handle) is a disk-shaped wafer, having a diameter equal to approximately 200 mm. Cavities 332 each have a depth of approximately 250 μm and each comprise a lateral wall extending from the bottom of the cavity to the opening of cavity 332, each cavity having orthogonally to its depth a square profile of 10.2 mm by 10.2 mm.

Stops 333*a*, 333*b* are for example made of silicon. If they are positioned in cavities, they each have a thickness greater by approximately 50 μm than the thickness of dies 320, for example in the range from approximately 375 μm to 425 μm. If they are positioned on surface 331*a* of support 331, then they have to be thinner than dies 320 by approximately 250 μm (substantially corresponding to the thickness of cavities 332).

The device for handling dies 320 may comprise: a pyramidal tool which only touches the sides of each picked-up die, a tool forming a clip catching each die by their lateral edges, or a tool using the Venturi effect to pick up each die.

The surface treatment (of the dies and/or of the substrate) comprises a 20-second $N_2$ plasma treatment to remove the hydrocarbon contamination of the surfaces to be assembled. The surface treatment may also comprise a removal of the particle contamination by a megasonic treatment of the dies and/or of the substrate. This megasonic treatment may be performed by using megasounds and a solution of deionized water added with ammonia at 1%, for example with a 1-MHz frequency and a 1-W/cm$^2$ power, such a megasonic treatment being known by those skilled in the art as shown for example by document "Innovative megasonic cleaning technology evaluated through direct wafer bonding." of F. Fournel et al., published in ECS Transactions, 33 (4) 495-500 (2010).

The after-treatment of dies 320 and/or of substrate 310 comprises a step of soaking in deionized water for one hour, followed by a step of drying by centrifugation at 2,000 rpm for 45 seconds.

To form liquid film 340, after deposition of the liquid on the first surface 310*a* of substrate 310, a step of centrifugation at 30 rpm for 20 seconds is implemented to form liquid film 340, to only leave on said first surface of said substrate a liquid film having a thickness in the range from approximately 50 μm to 75 μm, more widely a thickness compatible to come into contact with dies 320 when support 331 and substrate 310 are separated, if present, by stops 333*a*, 333*b*.

Liquid film 340 is a deionized water film. Deionized water has the advantage of not leaving residues after evaporation.

To lift up substrate 310, support element 335 is raised by approximately 300 μm.

The evaporation of liquid film 340 is performed for between 30 minutes and 6 hours, for example, 4 hours, at room pressure and temperature under 45% of humidity.

FIGS. 4A to 4E are cross-section views showing steps of a method of capillarity-assisted direct bonding according to a second embodiment.

This method implements an assembly system 430 comprising:

- an adhesive film 432 (forming a die support) adapted to having dies 420 held by adhesion on a first surface 432*a* of said film intended to be in front of substrate 410 for the assembly of said dies to said substrate, said adhesive film having an elasticity such that it can deform to enable the dies to come closer to the substrate during a step of evaporation of a liquid film on the substrate, as described hereafter;
- an upper support element 435 comprising an opening 435*a* in its central portion, and adapted to being fastened to two end portions of adhesive film 432 on the side of the second surface 432*b* of said film;

- a frame 437 (or ring) adapted to being fastened to two end portions of adhesive film 432 by adhesion on the first surface 432*a* of said film;
- optionally, stops 433*a*, 433*b* (or wedges) adapted to being positioned on the first surface 432*a* of adhesive film 432, to stop the bringing together that ensures the placing into contact of dies 420 with substrate 410, more precisely with a liquid film 440 formed on the substrate, as described hereafter;
- a lower support element 434;
- upper support element 435 being displaceable with respect to lower support element 434, for example using guides 436*a*, 436*b*; and
- optionally, a support 431 of substrate 410.

Adhesive film 432 can thus be held between upper support element 435 and frame 437.

Adhesive film 432 may for example be thermal release or UV-exposure release adhesive film.

Figure 4A:
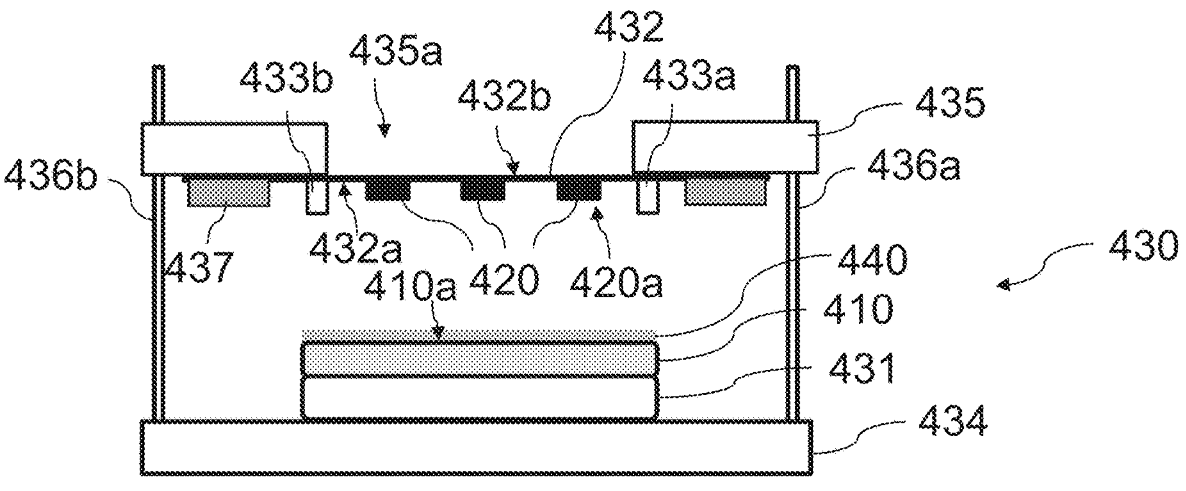
FIG. 4A, FIG. 4B, FIG. 4C, FIG. 4D, and FIG. 4E are cross-section views showing steps of a method of assembly by capillarity-assisted direct bonding according to a second embodiment.

Steps of the method are described hereafter first in relation with FIG. 4A.

Adhesive film 432 is stretched and rigidly assembled to frame 437 (by adhesion with two end portions of the adhesive film on the first surface 432*a* of said film), then dies 420 are pasted to said first surface of said adhesive film between said end portions.

Dies 420 may be positioned on adhesive film 432 by means of a die handling device (pick-and-place), while avoiding touching the surfaces of the dies which are going to be bonded by direct bonding to substrate 410.

Once dies 420 are in position on adhesive film 432, a step of surface treatment of said dies, for example, a $N_2$ plasma treatment or an ozone treatment in air, is carried out. The surface treatment of each die 420 is performed at least on a first surface 420*a* of said die intended to be assembled to substrate 410.

Then, an after-treatment of dies 420 comprising a step of placing into contact of said dies with, for example, of soaking in, an aqueous solution comprising at least 90% of water, is carried out, for at least 30 minutes and preferably at least 1 hour, followed by a step of drying of said dies, for example, by centrifugation. The placing into contact with the aqueous solution is performed at least with the first (treated) surfaces 420*a* of the dies.

After the steps of surface treatment and of after-treatment of dies 420, stops 433*a*, 433*b* may be arranged on the two end portions of the first surface 432*a* of adhesive film 432, said dies 420 being between said stops.

Frame 437—with adhesive film 432 and dies 420—is flipped, and then fastened to upper support element 435, for example, by suction exerted by said upper support element on the two end portions of adhesive film 432, on the side of the second surface 432*b* of said film. Preferably, upper support element 435 is substantially horizontal during the positioning of frame 437, and held substantially horizontal afterwards, typically at most plus or minus 1°, and preferably at most plus or minus 0.1°.

Substrate 410, and in particular a first surface 410*a* of said substrate intended to be assembled with dies 420, may be prepared for the direct bonding according to techniques known by those skilled in the art, for example, without using an $N_2$ plasma, nor UV-ozone, more generally with no surface treatment in a nitrogen atmosphere, and with no after-treatment in an aqueous solution.

A liquid film 440, for example, a water film, is formed on the first surface 410*a* of substrate 410, for example, by deposition of the liquid and then centrifugation. The thickness of the liquid film is for example in the range from 10 to 100 μm.

Substrate 410 is then positioned on lower support element 434, in certain cases via a substrate support 431. Preferably, lower support element 434 and, possibly, support element 431, is substantially horizontal during the positioning of substrate 410, and held substantially horizontal afterwards, typically at most plus or minus 1° and preferably at most plus or minus 0.1°.

Figure 4B:
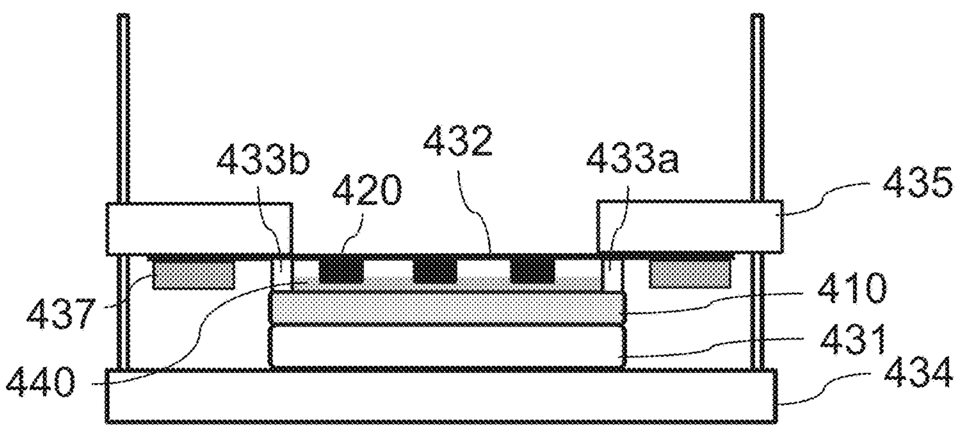

Then, as illustrated in FIG. 4B, upper support element 435 (with adhesive film 432, frame 437, and dies 420) is lowered so that dies 420 come into contact with liquid film 440. This positioning may correspond to laying stops 433*a*, 433*b* on substrate 410.

Figure 4C:
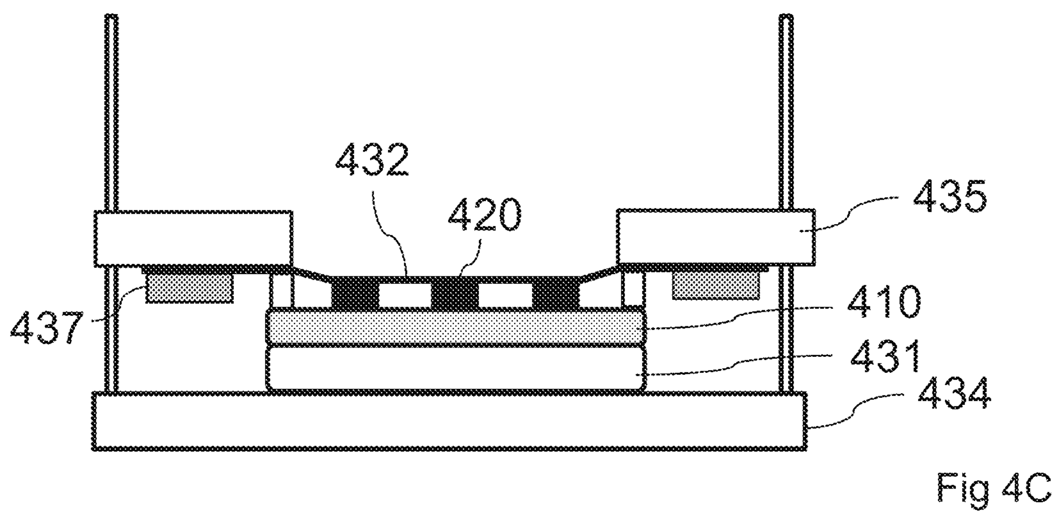

Then, liquid film 440 is evaporated. As soon as the time necessary for the evaporation of the liquid film has elapsed, as illustrated in FIG. 4C, adhesive film 432 deforms to enable dies 420 to come closer to substrate 410. Dies 420 are then assembled by direct bonding on substrate 410.

Figure 4D:
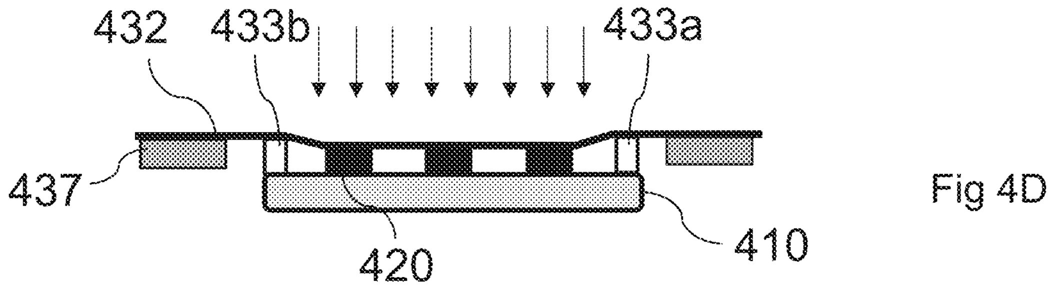

Then, as illustrated in FIG. 4D, the assembly comprising substrate 410, dies 420, adhesive film 432, frame 437, and stops 433*a*, 433*b* is separated from the rest of system 430. Then, adhesive film 432 is submitted to heat or to a UV radiation, to peal it and remove it.

Figure 4E:
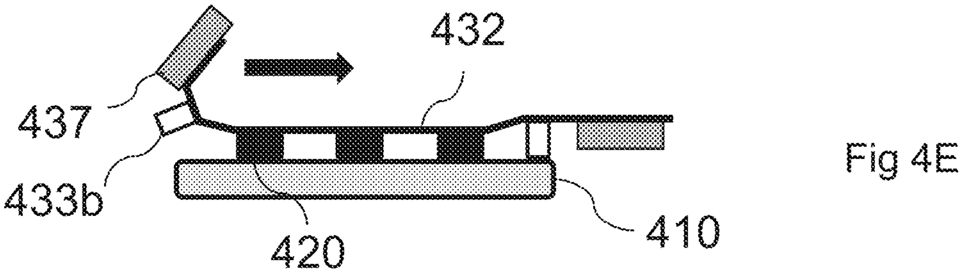

Frame 437 and stops 433*a*, 433*b* are removed with adhesive film 432, as illustrated in FIG. 4E.

A substrate/die structure isolated from system 430 is thus obtained.

As known by those skilled in the art, this substrate-die structure is then annealed, for example at 200° C. or 400° C., or even more.

A specific example of the second embodiment is now provided.

Before being pasted to the adhesive film, dies 420 are prepared as follows: the thickness of three indium phosphide wafers (InP) having a 50-mm diameter which will be sawn to form dies 420 is measured. The measured thicknesses of these three wafers are all in the range from 325 μm to 375 μm. Dies 420 are formed by sawing of the three InP wafers. These dies 420 each have, orthogonally to their thickness, a square profile of 10 mm by 10 mm.

Adhesive film 432 is an adhesive film sensitive to UV rays, for example, an Adwill D-650 film. Said film is stretched on frame 437. The frame is a cutting ring.

Stops 433*a*, 433*b* have a thickness greater by approximately 50 μm than the die thickness, for example in the range from approximately 375 μm to 425 μm. They are for example made of silicon.

The device for handling dies 420 may comprise: a pyramidal tool which only touches the sides of each picked-up die, a tool forming a clip catching each die by their lateral edges, or a tool using the Venturi effect to pick up each die.

The surface treatment of the dies comprises a 10-minute ozone ($O_3$) UV treatment to remove the hydrocarbon contamination of the surfaces intended to be assembled to the substrate. The treatment may also comprise a removal of the particle contamination for a megasonic treatment of the dies. This megasonic treatment may be performed by using megasounds and a solution of deionized water added with ammonia at 1%, for example, with a 1-MHz frequency and a 1-W/cm$^2$ power.

The after-treatment of dies 420 comprises a step of soaking for two hours in deionized water where soda has been diluted at a 104 mass concentration, followed by a step of drying by means of a drier.

According to the example of embodiment, the surface treatment of the substrate is performed without using an $N_2$ plasma or UV-ozone treatment, more generally with no surface treatment in a nitrogen atmosphere, and there is no after-treatment of the substrate by placing into contact with an aqueous solution.

To form liquid film 440, after deposition of the liquid on the first surface 410*a* of substrate 410, a step of centrifugation at 30 rpm for 20 seconds is implemented to form liquid film 440, to only leave at the first surface of substrate 410 a liquid film having a thickness in the range from approximately 50 μm to 75 μm, more widely a thickness compatible to come into contact with dies 420 when adhesive film 432 and substrate 410 are separated by stops 433*a*, 433*b*.

Liquid film 440 is a deionized water film. Deionized water has the advantage of not leaving residues after evaporation.

The evaporation of liquid film 440 is performed for between 30 minutes and 6 hours, for example, 4 hours, at room pressure and temperature under 45% of humidity.

The adhesive film 432 selected in the example of embodiment being a UV-sensitive adhesive film, it is submitted for its separation to UV radiations adapted to easing the pealing thereof. For example, an adapted UV radiation may be of 160 $mJ/cm^2$. After submission to UV rays, the adhesive film is pealed to be separated from dies 420.

For the first and/or the second embodiment, and more generally for a preparation method or an assembly method according to an embodiment, the following variations of the preparation may be provided, taken alone in combination:

- the aqueous solution may be: deionized water; deionized water to which a base or an acid has been added with a concentration lower than 10%, preferably lower than 1%, for example, ammonia, or DEAE (Diethyleamino-ethanol) for the base, sulfuric acid or hydrochloric acid for the acid; deionized water to which an amphoteric compound has been added, for example, oxygenated water;
- the placing into contact with the aqueous solution, for example, the soaking in said solution, is longer than 30 minutes, for example, longer than 1 hour;
- the placing into contact with the aqueous solution, for example, the soaking in said solution, may be carried out at room temperature or at a temperature higher than the room temperature, preferably at a temperature lower than 100° C., or more preferably lower than 80° C.; this may be performed by heating of the aqueous solution;
- the drying may be obtained by any adapted drying means known in microelectronics techniques, the given examples of drying by centrifugation or of drying by using a drier being non-limiting.

Details of assembly systems according to the first or the second mode are for example given in patent application FR3105569A1.

Figure 5:
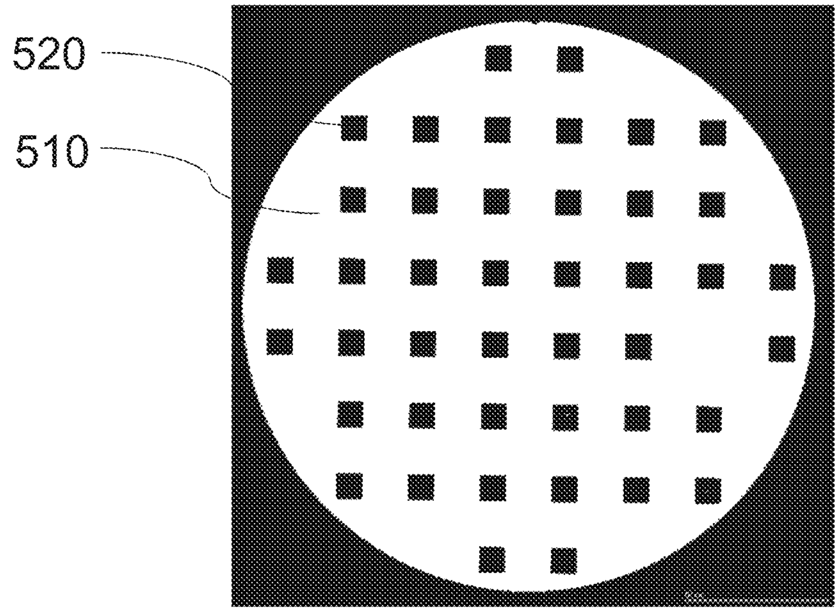
FIG. 5 is an acoustic microscope view of dies on a substrate after a method of assembly by capillarity-assisted direct bonding according to an embodiment.

FIG. 5 is an acoustic microscope view of dies 520 on a substrate 510 after a method of assembly by direct bonding according to an embodiment, which shows that said method enables to strongly decrease the defectivity at the bonding interface of dies on the substrate after the drying of the film or of the drop of liquid, since white dots can no longer be observed on the dies.

Figure 6A:
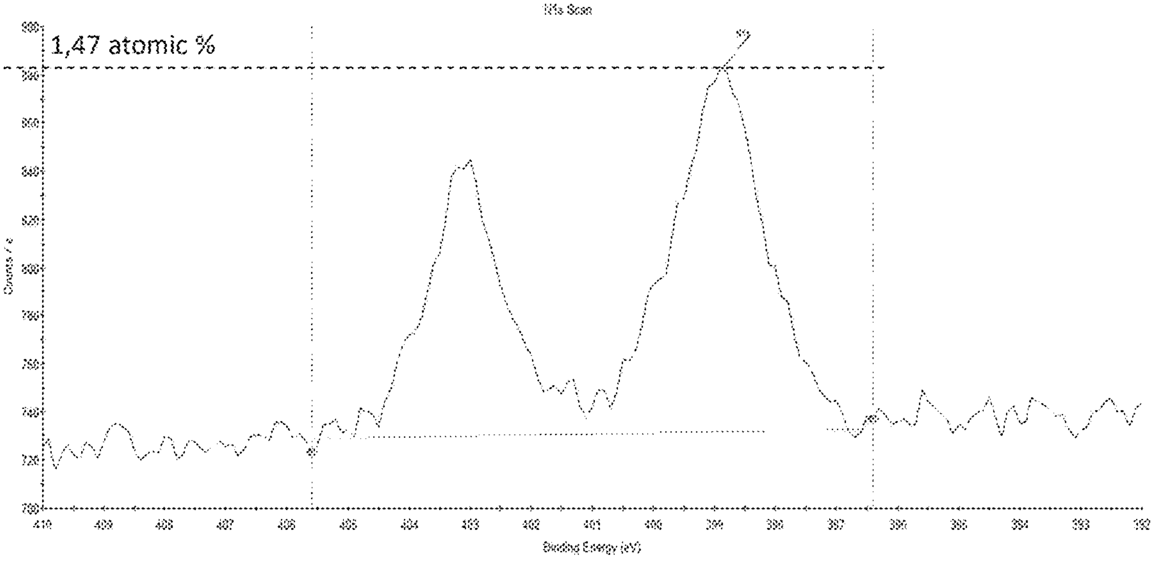
FIG. 6A and FIG. 6B show results of nitrogen measurement by XPS spectrometry of surfaces treated with a nitrogen plasma, where one is submitted to no after-treatment, and the other is submitted to an after-treatment by soaking in an aqueous solution.
Figure 6B:
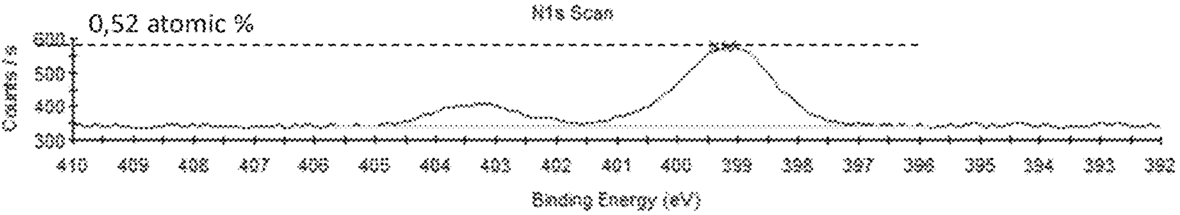

FIG. 6A and FIG. 6B show the results of nitrogen measurement by XPS (X-Ray Photo-electron Spectroscopy) spectrometry of surfaces treated with a nitrogen plasma, where one is submitted to no after-treatment (FIG. 6A), and the other is submitted to an after-treatment by soaking in an aqueous solution (FIG. 6B). In the curves, the nitrogen mainly appears in the form of two peaks: a nitrogen peak linked to Si, which is the highest, and a nitrogen peak linked to $SiO_2$.

The results are also given in the following table, corresponding to the nitrogen peak linked to Si:

TABLE 1

| Measured N1s peak (nitrogen atomic orbital) | Atomic % of N |
|---|---|
| $N_2$ plasma treatment with no after-treatment | 1.47 |
| $N_2$ plasma treatment with after-treatment | 0.52 |

These results clearly show the effect of the after-treatment which enables to remove a significant portion of the nitrogen implanted by the plasma at the surface and at the sub-surface.

The inventors have indeed determined that nitrogen could implant at the surface and at the sub-surface, typically down to from 3 to 4 nm under a surface treated by a treatment implementing nitrogen, such as an $N_2$ plasma or UV-ozone treatment, and was linked to the observed defective bonding observed after the capillarity-assisted direct bonding. The performed after-treatment enables to remove a significant portion of this nitrogen, thus enabling to significantly decrease the defects obtained after the bonding. The removal of the nitrogen introduced by an $N_2$ plasma treatment or a UV-ozone treatment before the direct bonding may also be advantageous for direct bondings which are not performed by evaporation of a liquid (direct bonding which is not assisted by capillarity), for example, to limit the mobile charges that might be trapped at the bonding interface.

Various embodiments and variants have been described. Those skilled in the art will understand that certain features of these various embodiments and variants may be combined, and other variants will occur to those skilled in the art. In particular, in each of the embodiments, the substrate may be prepared either according to a preparation method similar to that of the dies, or according to techniques known by those skilled in the art, for example, without using an $N_2$ plasma, nor UV-ozone and with no after-treatment by placing into contact with an aqueous solution and drying. Further, the direct bonding may be a direct bonding not assisted by capillarity.

Finally, the practical implementation of the described embodiments and variations is within the abilities of those skilled in the art based on the functional indications given hereabove.

The invention claimed is:

1. Method of preparation of a first surface of an electronic component, said first surface being intended to be bonded to another electronic component by a direct bonding and said first surface having previously been submitted to a surface treatment in an atmosphere comprising nitrogen, for example, a treatment in a nitrogen plasma or an ozone UV treatment, the preparation method comprising:

- treating the first surface and a sub-surface under the first surface by placing into contact said first surface with an aqueous solution comprising at least 90% of water by mass, for a contacting duration longer than or equal to 30 minutes to remove a portion of the nitrogen used in the surface treatment from said first surface and sub-surface; and then
- the drying of said first surface.

2. Preparation method according to claim 1, wherein the contacting duration is longer than 30 minutes, for example longer than or equal to 40 minutes, or even longer than or equal to 50 minutes.

3. Preparation method according to claim 1, wherein the aqueous solution is deionized water, or a solution of deionized water to which a base or an acid has been added with a concentration lower than 10% by mass, preferably lower than 1% by mass, or a solution of deionized water to which an amphoteric compound has been added, for example, oxygenated water.

4. Preparation method according to claim 1, wherein the placing into contact with the aqueous solution is performed at a temperature higher than room temperature and lower than 100° C., preferably lower than 80° C.

5. Preparation method according to claim 1, comprising, prior to the step of placing into contact with the aqueous solution, a step of a treatment of the first surface in an atmosphere comprising nitrogen, for example, with a nitrogen plasma or an ozone UV treatment.

6. Method of assembly by direct bonding of a first surface of at least one first electronic component and of a first surface of a second electronic component, the assembly method comprising a step of preparation of at least one among the first surface of the at least one first electronic component and the first surface of the second electronic component according to the method of preparation of claim 1, prior to the direct bonding.

7. Method of assembly according to claim 6, wherein the direct bonding is a capillarity-assisted direct bonding.

8. Method of assembly according to claim 7, wherein the direct bonding is obtained by evaporation of a liquid, preferably water, arranged between the first surface of the at least one first electronic component and the first surface of the second electronic component.

9. Method of assembly according to claim 6, wherein there is a plurality of said at least one first electronic component, said first electronic components being electronic dies, and the second component being a substrate, for example, a wafer.

10. Method of assembly according to claim 9, comprising:

a step of positioning of the dies on a die support, said support being adapted to holding the dies in individualized way for their assembly to the substrate;

a step of a forming of a liquid film, for example, a deionized water film, on the first surface of the substrate;

a step of placing into contact of the dies with the liquid film, said placing into contact causing an attraction of said dies towards the substrate;

a step of evaporation of the liquid film so as to bond the dies to the substrate by direct bonding;

the step of preparation comprising preparation of the first surfaces of the dies, and being carried out after the positioning step, and before the step of placing into contact with the liquid film.

11. Method of assembly according to claim 10, wherein the placing into contact of the dies with the liquid film is ensured by bringing together the substrate and the die support.

12. Method of assembly according to claim 10, comprising the use of at least one stop arranged between the substrate and the die support to stop the bringing together that ensures the placing into contact of the dies with the liquid film.

13. Method of assembly according to claim 10, the die support comprising cavities, each die being positioned in a cavity, the first surface of said die protruding from said cavity, the method comprising a step of removal of the dies from the cavities, said removal step being implemented after the placing into contact of the dies with the liquid film and before the bonding of the dies to the substrate.

14. Method of assembly according to claim 10, the die support comprising an adhesive film having the dies pasted thereto, said adhesive film having an elasticity such that it deforms during the evaporation step, the method comprising, after the bonding of the dies to the substrate, a step of removal of the adhesive film.

15. Method of assembly according to claim 14, wherein the step of removal of the adhesive film comprises a step of heating of said adhesive film or a step of exposure of said adhesive film to an ultraviolet radiation.

16. Preparation method according to claim 1, wherein the removed portion is a significant portion corresponding to more than 50% of the atomic % of nitrogen, preferably more than 65% of the atomic % of nitrogen.

* * * * *